United States Patent [19]
Taylor et al.

[11] Patent Number: 4,868,716
[45] Date of Patent: Sep. 19, 1989

[54] RF INTERCONNECT AND SHIELDING SYSTEM

[75] Inventors: David B. Taylor, Greenacres, Wash.; Steven C. Zemke, Post Falls, Id.

[73] Assignee: Hewlett-Packard Company, Palo Alto, Calif.

[21] Appl. No.: 220,049

[22] Filed: Jul. 15, 1988

[51] Int. Cl.[4] .............................................. H05K 9/00
[52] U.S. Cl. ...................................................... 361/424
[58] Field of Search ....................... 361/424, 422, 390; 174/35 R, 35 MS

[56] References Cited

U.S. PATENT DOCUMENTS

| | | | |
|---|---|---|---|
| 3,904,810 | 9/1975 | Kraus | 174/35 MS |
| 4,370,515 | 1/1983 | Donaldson | 174/35 R |
| 4,642,735 | 2/1987 | Hodsdon et al. | 174/35 R |

*Primary Examiner*—Roy N. Envall, Jr.
*Attorney, Agent, or Firm*—William J. Bethurum

[57] ABSTRACT

The connection and shielding system for modular RF circuits encases modular circuitboards (10) within five-sided enclosures (11). The sixth side of each enclosure is provided by the top ground plane of a base circuitboard (20) that supports and electrically interconnects the components of the modular circuitboards (10). Enclosures (11) are fixed to a grounded metal socket formed by fence strips (22) and metal inserts (23) which form upwardly open slots including yieldable longitudinal gaskets (50). Gaskets (50) yieldably grip the open end of enclosures (11) and seal them against escaping radiation. Further radiation shielding is provided about the base circuitboard (20) by the fact that the conductive signal traces provided in it are sandwiched between two continuous ground planes and run between plated-through vias joining the ground planes. The ends of each enclosure are provided with double wall baffles (17, 18) which provide airflow to the interior and RFI shielding through offset open apertures (13).

14 Claims, 7 Drawing Sheets

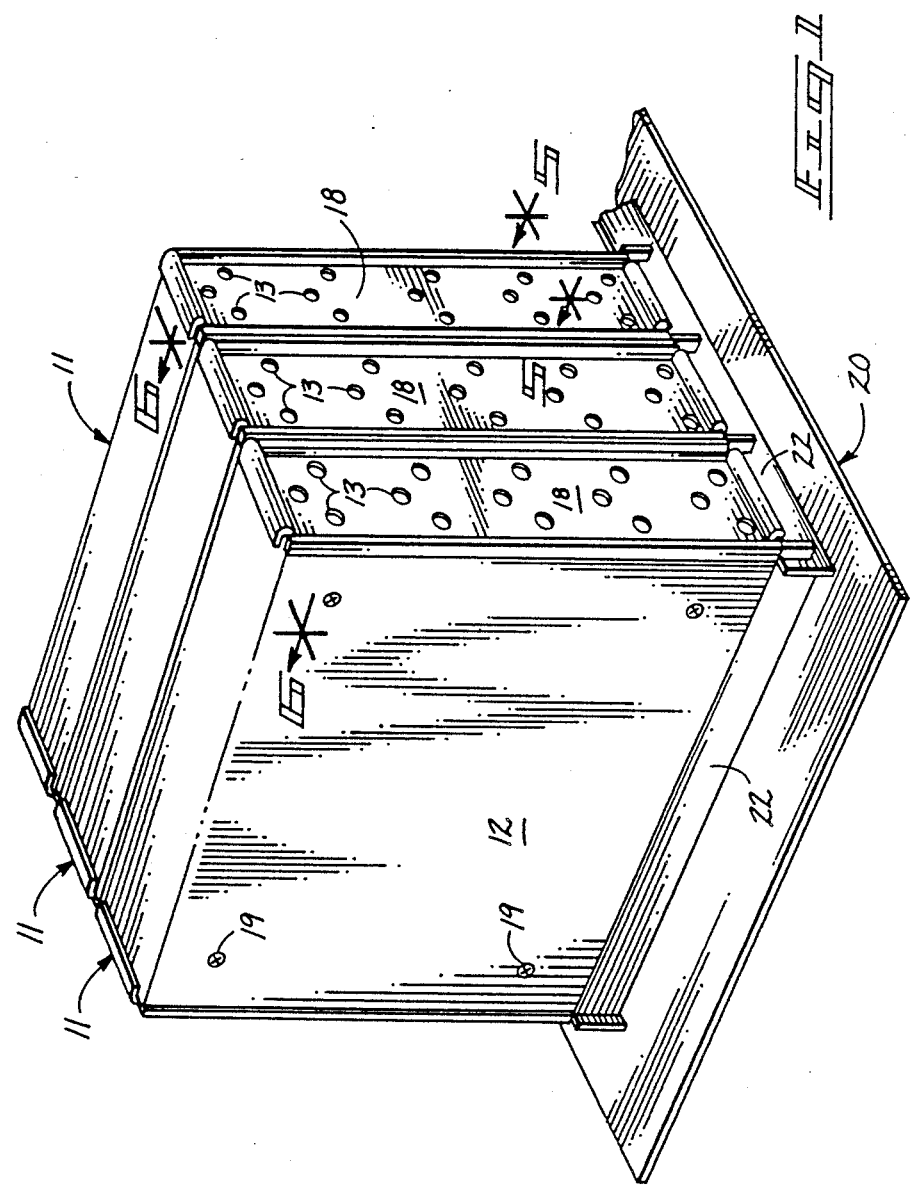

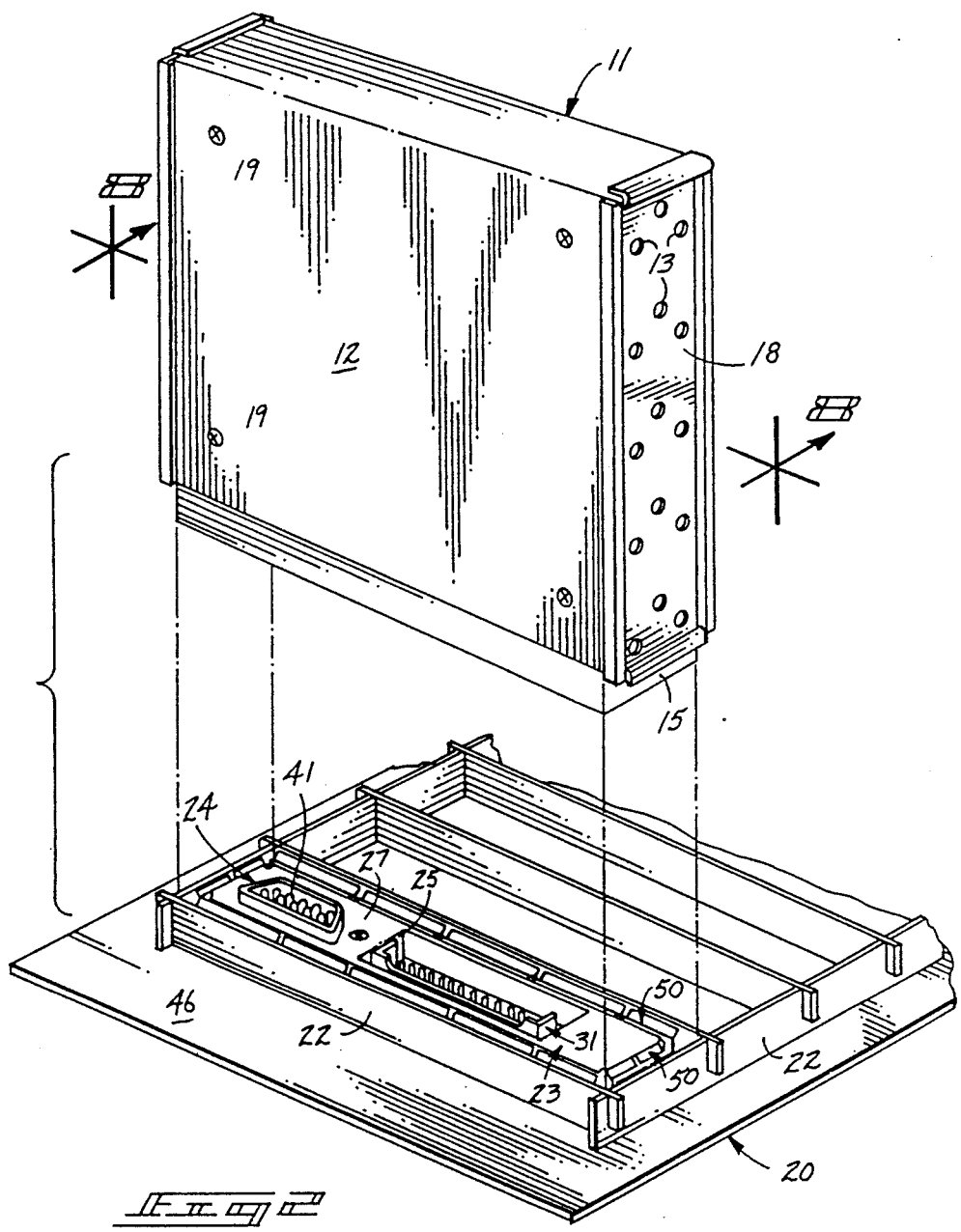

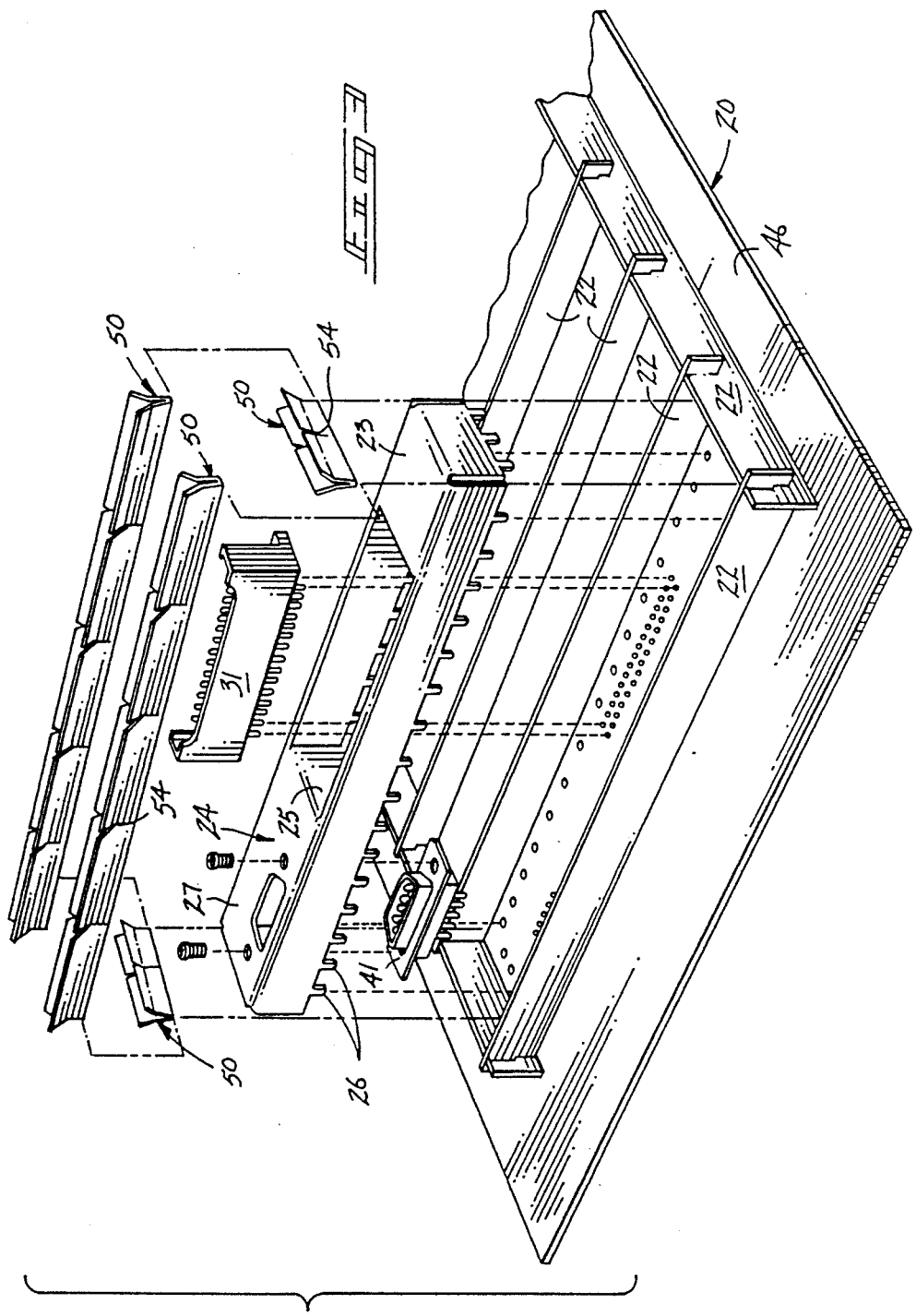

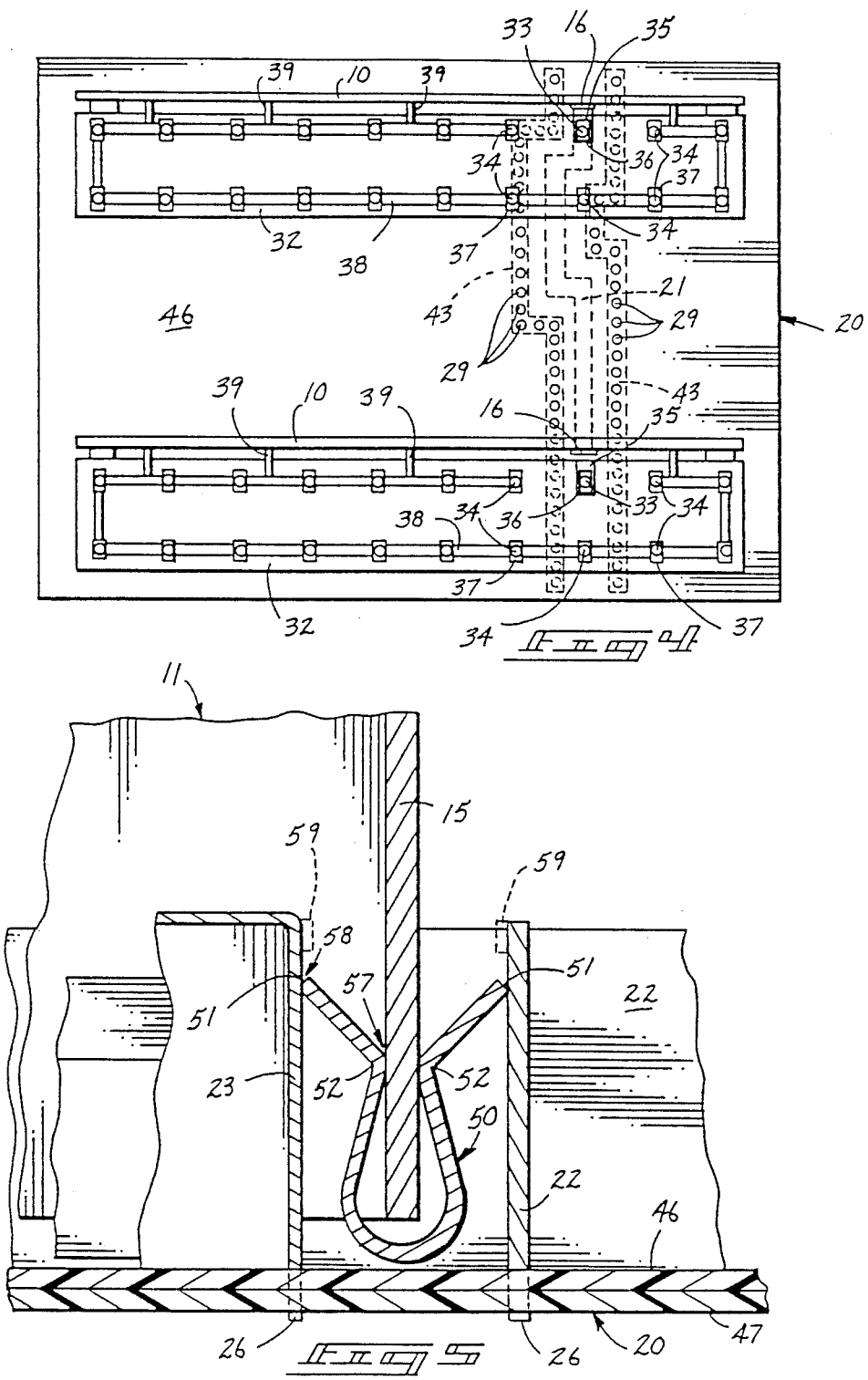

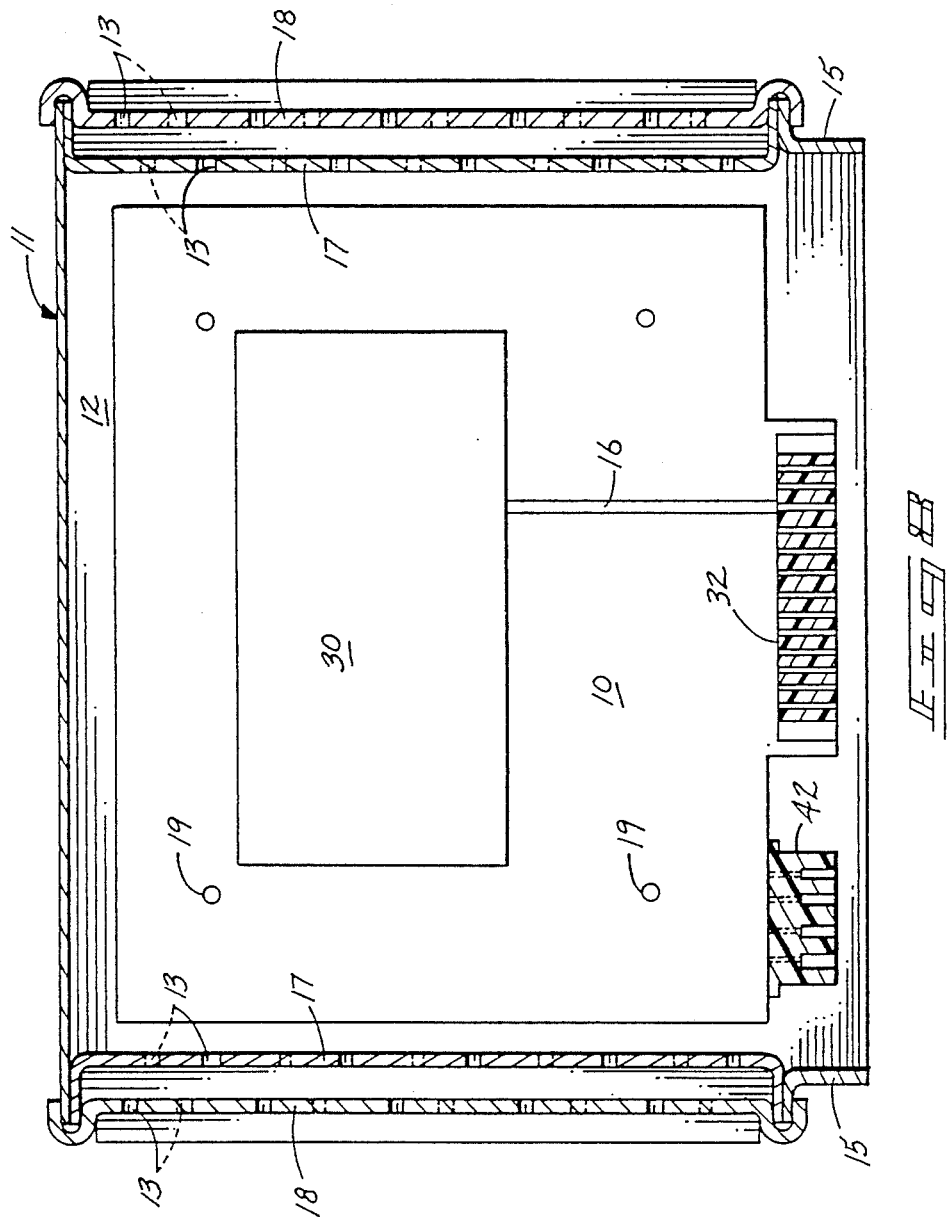

4,868,716

RF INTERCONNECT AND SHIELDING SYSTEM

TECHNICAL FIELD

This disclosure relates to improvements in a system for interconnecting modular circuits included within analog radio frequency instruments arranged for interchangeability about a base circuitboard. It also provides unique shielding of the modular circuits and the connections to prevent radio frequency interference between them and to prevent escape of radiation to the exterior of the instrument.

BACKGROUND ART

The design of radio frequency (RF) circuits requires careful attention to containment of the electrical and magnetic fields created at their operating frequencies. Instruments utilizing analog circuits at radio frequencies pose significant challenges in this area, as contrasted to digital circuit designs which require substantially less containment of radio frequencies due to the fact that digital circuits are far less sensitive to radiated interference. In analog circuits, isolation of one signal to another is vital to accurate circuit operation. Furthermore, escaping radiation can interfere with proper operation of nearby external electronics, such as radios, television receivers, and other devices.

Analog electronic instrumentation is typically encased within metal enclosures that are grounded to minimize radiation leakage to the exterior of the instrument and radiation cross coupling to other circuits. Openings in these enclosures require radiation gaskets, typically in the form of elongated metal spirals, braids, or flat spring forms that are compressed by pressure of a cover that bears against the gasket in only one direction. Such gaskets provide sealing to the cover along a single line extending across one cover surface. The dimensions and tolerances of the gaskets and covers are therefore critical to a good seal being established.

It is also well known that radio frequency interference (RFI) can occur within the various conductive elements of printed circuitboards as radio frequency signals are transmitted through selected traces. Guard traces are typically provided alongside such traces to minimize such interference. Signal traces in base circuitboards, used to interconnect modular RF signal circuits, are a potential source of radiation leakage in such instrumentation.

The present invention was designed to maximize the exterior shielding of analog electronic circuits by improvement of the enclosure and gasket technology used to prevent leakage of radiation from the interior operating environment of the circuits. It is directed specifically to the interconnection of such enclosures and a base circuitboard through which interconnections are made between modular circuits included within an electronic instrument. It relates the enclosures to the base circuitboard structure, so that the top ground plane of the base circuitboard completes the enclosures and contains the fields generated by the modular circuits. The present invention is also directed to the interconnections made between modular circuits included within an electronic instrument.

DISCLOSURE OF INVENTION

The connection and shielding system comprises a plurality of modular circuitboards with ground planes and RF signal traces plus analog electronic devices that produce signals in the RF signal traces. The system utilizes a base circuitboard that interconnects the modular circuitboards. The base circuitboard has a multilayer structure with two outer ground planes and at least one inner layer of conductive traces. Signal interconnections between the modular circuitboards and the base circuitboard are accomplished through conventional multi-pin connectors that complete circuits between conductive traces on the base circuitboard and RF signal traces on the modular circuitboards without destroying the integrity of the enclosure or the necessary ground return paths along the RF signal paths. To provide grounded shielding at these interconnections, the pins and sockets selected for conducting the RF signals are surrounded by grounded pins and sockets that lead to traces on the base circuitboard that extend between grounded vias. Together with the top and bottom ground plane, these vias provide ground return paths that substantially surround the conductive signal traces. Metal enclosures encase the modular circuitboards. Each enclosure has an open end defined by peripheral projecting walls. A grounded metal socket assembly is fixed to the top ground plane of the base circuitboard to receive the open end of each enclosure. Radio frequency interference gaskets are positioned between the open end of each enclosure and the receiving socket assembly for grounding the enclosure and preventing escape of radiation from within it while it is mounted on the base circuitboard.

BRIEF DESCRIPTION OF DRAWINGS

The preferred embodiment of the invention is illustrated in the accompanying drawings, in which:

FIG. 1 is a perspective view of an assembled electronic instrument;

FIG. 2 is a partially exploded perspective view of the instrument showing one circuit module and the base assembly;

FIG. 3 is an exploded perspective view of the base assembly components;

FIG. 4 is a schematic plan view showing a signal trace extending along the base circuitboard;

FIG. 5 is a sectional view taken along line 5—5 in FIG. 1, showing details of the enclosure gaskets;

FIG. 8 is a simplified cross-sectional view taken along line 8—8 in FIG. 1 showing an enclosure and modular circuitboard.

BEST MODE FOR CARRYING OUT THE INVENTION

The drawings illustrate one preferred embodiment of the invention, which incorporates several connection and shielding improvements for radio frequency (RF) circuits arranged on modular circuitboards (sometimes termed "daughter boards") used in association with a base circuitboard (sometimes referred to as a "mother board"). The releasable connection elements of the system include applications of conventional multi-pin connectors between the modular circuitboards and the base circuitboard, as well as grounded shielding structures that serve as ground return paths along the connecting signal traces within the base circuitboard for providing shielding similar to that available by use of more costly conventional coaxial cables. The shielding elements include a modular enclosure for each modular circuit, having ventilated end panels, a mounting socket at the top surface of the base circuitboard for holding the enclosure in place, and a unique form of radio frequency interference (RFI) gasket interposed between the mounting socket on the base circuitboard and the enclosure. The combination of these elements provides a modular circuit package that can be readily assembled or disassembled during both construction of an instrument and subsequent repair or testing of it. The assembled components minimize leakage of radio frequency radiation from the modular circuitboard enclosures and base circuitboard elements.

FIG. 1 shows part of an assembled electronic instrument, which might be any radio frequency testing equipment, such as a signal generator. The enclosed components of the instrument house circuitry that includes analog electronic devices forming circuits that produce radio frequency signals along selected traces in the supporting printed circuitboards. The assembled circuitry is housed within parallel modular enclosures 11 that are frictionally attached in perpendicular orientation to a base circuitboard 20. The base circuitboard 20 includes appropriate traces to interconnect the modular circuits and devices within a plurality of the parallel enclosures 11.

The invention is not directed to the specifics of the circuitry for the instruments, but to the physical connecting assemblies for the electronic and circuitboard components, as well as the shielding elements provided in conjunction with the housings and the RF signal traces to prevent leakage of radiation to the exterior of the instrument. In general, details of the physical structure and specific electronic circuits and devices mounted on each modular circuitboard 10 is not necessary to an understanding of the present system for connecting and shielding such circuits.

Figure 6:
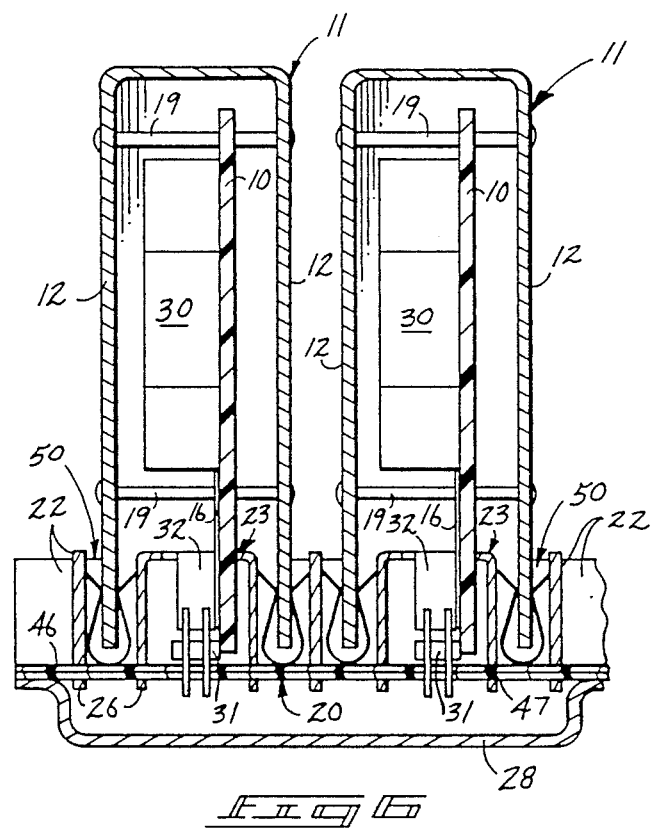
FIG. 6 is a simplified vertical sectional view through two modular enclosures as seen along line 6—6 in FIG. 1.

Referring to FIGS. 6 and 8, each enclosure 11 houses a modular circuitboard 10 having an RF circuit mounted to it. The modular circuitboards 10 are adapted to be arranged in planes perpendicular to the plane of the base circuitboard 20. They are held in this perpendicular position by mounting screws 19 attached between the surrounding enclosure 11 and each interior modular circuitboard 10. The modular circuitboards 10 and enclosures 11 can be attached to the base circuitboard 20 or removed from it by hand. This facilitates assembly, disassembly and repair of the modular components making up the electronic instrument.

Each modular circuit will include one or more RF signal traces 16 (see FIGS. 6 and 8), through which radio frequency signals are directed between the modular circuitboards 10 by the underlying base circuitboard 20. Each modular circuitboard 10 will also contain a continuous ground plane and is provided with various power and control traces (not shown) that require electrical interconnections through the base circuitboard 20.

As shown in FIGS. 1, 2, 6, 7 and 8, each enclosure 11 is in the form of a rectangular box including solid continuous metal side walls 12 that are arranged parallel to the interior circuitboard 10. Each enclosure 11 also includes a bottom opening defined by the lower extensions of the side walls 12 and bent end walls 15. Walls 12 and 15 together present a continuous peripheral wall configuration about the bottom enclosure opening that includes interior and exterior wall surfaces arranged perpendicularly with respect to the plane of the base circuitboard 20. The intersecting walls 12 and 15 have a configuration loosely receivable within a socket assembly on the base circuitboard 20. They terminate along coplanar bottom edges of enclosure 11.

Figure 7:
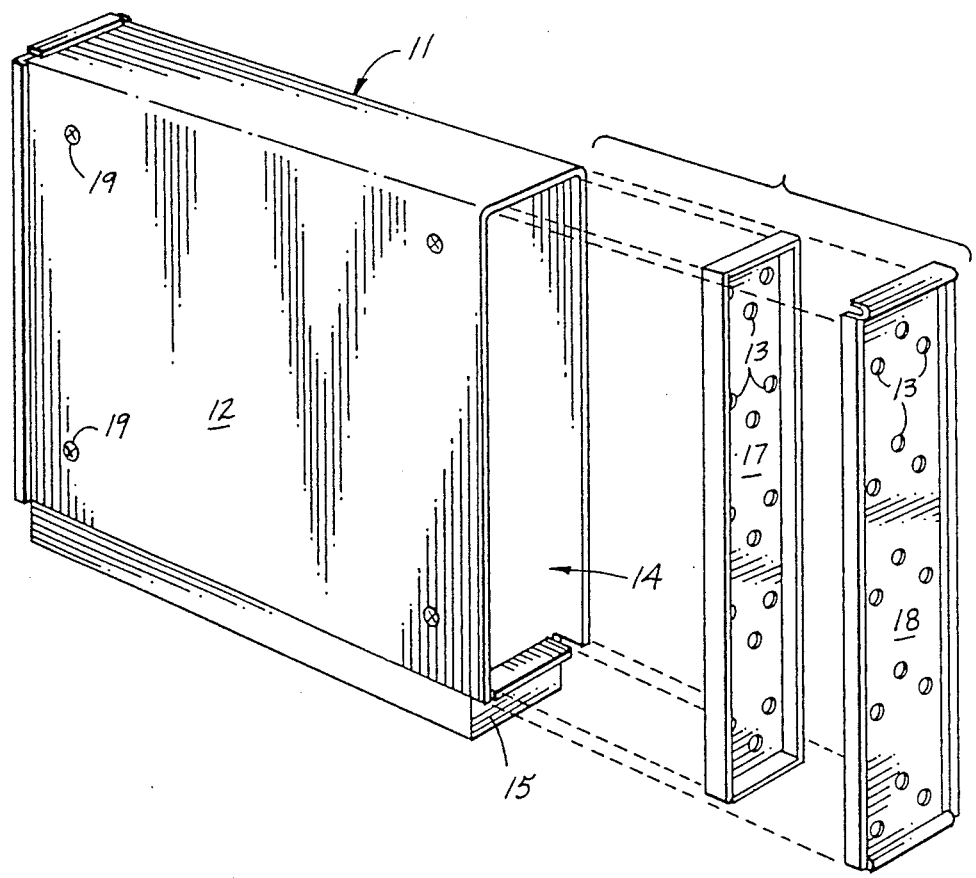
FIG. 7 is an exploded view showing the cover assembly at one end of a modular enclosure.

The interior of each enclosure 11 is ventilated through oppositely facing end wall assemblies that include double wall baffles comprised of baffle walls 17 and 18. Environmental ventilation or airflow for cooling purposes is provided to the interior of enclosure 11 by staggered rows of apertures 13 formed respectively through the baffle walls 17 and 18. The patterns for locating the plurality of apertures 13 are selected to eliminate overlap between the apertures of the two baffle walls 17 and 18 in planes perpendicular to them. The staggered apertures 13 prevent direct escape of radiation from within the interior of enclosure 11, while providing adequate ventilation for dissipating heat produced by the circuits and devices housed in it. The baffle walls 17 and 18 at each end of enclosure 11 are slightly spaced from one another and are bent and crimped (as shown in FIGS. 7 and 8) to eliminate any physical gaps through which interior radiation might leak through the open ends 14 in enclosure 11.

The end walls 17 and 18 form a double-wall cover fixed across end openings leading to the interior of the box. The perimeter of each opening is defined by the spaced continuous side walls 12 and the perpendicular top and bottom walls that join them along a continuous coplanar end edge. Each of the end walls 17 and 18 has a periphery sealingly engaged about the perimeter of the end box openings. The first baffle wall 17 has elongated bent edges about its perimeter sealingly engaging the respective walls about the end box opening within which it is received. The second baffle wall has elongated bent edges about its perimeter that are doubled back upon themselves and sealingly engage the elongated bent edges of wall 17 and the peripheral walls of the end opening of the enclosure 11. The bent edges of baffle wall 18 are crimped tightly to secure baffle walls 17 and 18 within each end opening of the enclosure 11 as a unitary shielding and ventilating structure. This is illustrated in cross-section in FIG. 8.

The one piece construction of the enclosure 11, in which solid side walls 12 are also bent to form the enclosure top wall and lower end wall 15, together with the elongated overlapping connections that crimp the baffle walls 17 and 18 to the enclosure 11 at each of its open ends, provides radio frequency shielding coverage about the enclosure on five sides, with no long gaps or cracks through which radiation leakage can occur. The base circuitboard 20, which has a full top side ground plane 46, forms the sixth side of the circuitboard shield (see FIG. 6). This is accomplished by grounding a metal socket assembly on the base circuitboard 20 to both its top ground plane 46 and its bottom ground plane 47, as described below, and by sealing the physical connections between the lower opening of enclosure 11 and the socket assembly by use of a resilient conductive gasket. Leakage of radiation from below the base circuitboard 20 is further prevented by a spaced solid metal cover 28.

The RF signal connections between each modular circuitboard 10 and the base circuitboard 20 are provided through a first releasable electrical connector of conventional design, shown as a multi-pin connector that includes separable complementary first and second connector elements 31, 32. Male connector element 31 is mounted to the upper side of the base circuitboard 20 and female connector element 32 is mounted to one side of a modular circuitboard 10 (see FIGS. 2 and 6). The illustrated connector elements 31 and 32, when joined to one another, complete a circuit between a conductive trace 21 within the base circuitboard 20 and the RF signal trace 16 on the modular circuitboard 10.

While only a single multi-pin connector is shown in the drawings for conducting RF signals between each modular circuitboard 10 and the base circuitboard 20, it is to be understood that multiple connectors can be provided to accommodate the RF signal path requirements of specific circuits included on the modular circuitboards 10.

In the arrangement shown, the male connector element 31 has one selected conductor or pin 33 electrically connected to the conductive trace 21 in the base circuitboard 20. The basic electrical connections are schematically illustrated in FIG. 4, which shows RF signal traces 16 on two typical modular circuitboards 10 and a base circuitboard 20. The five pins 34 adjacent to the selected pin 33 are electrically connected to both ground planes of the base circuitboard by plated-through connections.

Again referring to FIG. 4, it can be seen that the receiving conductor or socket 36 on the female connector element 32 corresponding in location to the selected pin 33 of the male connector element 31 is electrically connected at 35 to the RF signal trace 16 on the modular circuitboard 10. Similarly, the adjacent five sockets 37 are individually connected directly to the ground plane by connections schematically at 38 and 39. To maintain signal path integrity through the mated connector elements 31, 32, it is most important that the pins and sockets directly adjacent to the selected signal pin 33 and receiving socket 36 be grounded to provide a surrounding grounded environment to the signal transmitting elements. At least one grounded pin and socket should separate any pins and sockets used for transmission of RF signals between the modular circuitboards 10 and the base circuitboard 20. However, where a greater number of pins and sockets are available due to the economics involved in connector choice, all of the remaining pins and sockets in the connector not used for signal trace communication purposes may be grounded.

The adjacent grounded pin and socket connections provided alongside the signal pin 33 and socket 36 maintain the integrity of the ground return path for the RF signals as provided on modular circuitboard 10 by its ground plane in a microstrip structure and on the base circuitboard 20 by its two ground planes in a stripline structure. Pin 33 and socket 36 therefore provide an effective interruptible conductive path between the signal traces on the modular circuitboard 10 and the interior of the base circuitboard 20 while maintaining the integrity of the six-sided shielded enclosure provided about modular circuitboard 10.

The base circuitboard 20 is conventional in structure. It is a multi-layer circuitboard having top and bottom outer ground planes 46 and 47 and at least one inner layer of conductive traces. These traces can include power and control signal traces, as well as the exemplary RF signal trace 21 discussed above.

A grounded metal socket assembly is fixed to the base circuitboard 20 at the full ground plane located at its upper side. It surrounds the first multi-pin connector and is shown as a series of intersecting fence strips 22 spaced about a metal insert 23, as shown in FIGS. 2 and 6. The purpose of the metal socket assembly is to frictionally mount and support the enclosure 11 that encases each modular circuitboard 10 and to electrically ground the top ground plane of the base circuitboard 10 to the modular enclosure 11. The perpendicular fence strips 22 protrude upwardly from the top ground plane of base circuitboard 20 (see FIG. 2). Fence strips 22 are slotted to interlock within one another without any physical gaps through which radiation might escape. Located immediately inward from each fence strip 22 are similar vertical walls of metal insert 23, which define an upwardly-open slot surrounding the multi-pin connector.

The socket assembly is completed by yieldable metal spring gaskets 50, whose cross-sectional configuration is detailed in FIG. 5. Gaskets 50 are further illustrated in FIGS. 3 and 8. Gaskets 50 fit within the upwardly open peripheral slot formed between the fence strips 22 and metal insert 23 for frictionally mounting enclosure 11 to the base circuitboard 20 with the connector elements 31 and 32 of the multi-pin connector joined to one another. A physical connection and radio frequency interference seal between each modular circuit assembly and the base circuitboard 20 is thereby provided by the frictional interconnections between enclosure 11 and gaskets 50, while the RF signal interconnections are provided through multi-pin connectors.

As can be seen in FIGS. 3, 5 and 6, the fence strips 22 and vertical walls of insert 23 are fixed to the base circuitboard 20 by means of a plurality of closely spaced legs 26 formed integrally along their lower edges. These legs 26 extend entirely through plated-through holes in the structure of base circuitboard 20 and are soldered to them to assure that they are electrically interconnected to both its top and bottom ground planes 46 and 47. The closely spaced legs 26 effectively ground the socket assembly to the top ground plane 46 of base circuitboard 20. They also complete a plurality of electrical connections between the socket assembly and both ground planes 46 and 47 of base circuitboard 20 in a shielding pattern within the circuitboard that surrounds the location of connector element 31.

As can be seen in FIGS. 2 and 3, a second multi-pin connector is provided between each modular circuitboard 10 and the base circuitboard 20. It also has complementary first and second connector elements 41, 42 mounted to the top side of the base circuitboard 20 and to the modular circuitboard 10, respectively. The first or male connector element 41 and the second or female connector element 42 are adapted to complete power and control circuits between traces provided in the base circuitboard 20 and traces on the modular circuitboard 10 (not shown). This second connector is preferably a filtered connector for direct current power and low frequency control signals. Filtered connectors capable of preventing passage of RF signals are readily available for this purpose. In contrast, the RF signal connectors must be unfiltered so as to not impede the passage of the signals transmitted through them.

The illustrated metal insert 23 of each socket assembly includes a base enclosure 24 that separates the connector element 31 and the connector element 41 at the top ground plane 46 of base circuitboard 20 (see FIG. 2). Base enclosure 24 about connector element 41 prevents radiation within enclosure 11 from coupling onto the control and power traces at the point where connector element 41 solders to base circuitboard 20. The base enclosure 24 includes a top wall 27 and an intermediate transverse wall 25, whose lower edge has a continuous row of legs 26 also extending through plated-through holes in both ground planes of the base circuitboard 20. Grounding isolation is provided by legs 26 about corridors extending across the base circuitboard 20 to confine radiation generated by RF signal traces from coupling onto the power and control lines. The multiple rows of grounded legs 26 for fence strips 22, inserts 23 and walls 25 at the bottom of the socket assemblies that mount the removable enclosures 11 to the base circuitboard 20 also assure that the ground planes 46, 47 at both sides of base circuitboard 20 are at a constant potential throughout their areas.

As shown schematically in FIG. 4, each conductive trace 21 within the base circuitboard structure is routed between two parallel rows of grounded holes or vias 29 formed completely through the base circuitboard 20 and soldered or plated-through to form electrical connections between its top and bottom ground planes 46, 47. The grounded vias 29 preferably intersect guard traces 43 extending alongside the conductive trace 21 to form a coplanar constant-potential grounded element to confine radiation in trace 21. Since trace 21 is located between the two full ground planes and the vias and guard traces 43, it is essentially surrounded on all sides by grounded elements. The result is an electrical connection in the base circuitboard 20 extending between the various modular circuitboards 10 similar in function to the shielding function of a coaxial cable having a grounded outer sheath.

The improved shielding characteristics of the present arrangement are achieved by a complete six-sided grounded enclosure for each modular circuitboard 10 - formed by enclosure 24, the socket assembly, gaskets 50 and the top ground plane 46. The multi-pin connectors and conductive traces in base circuitboard 20 provide a shielded electrical connection between the circuits of the modular circuitboards 10 which pierces this full shield without destroying its integrity. Each RF signal connection within the base circuitboard is shielded by running between its top and bottom ground planes 46, 47 and the adjacent rows of vias 29.

The details of gaskets 50 can best be seen by reference to FIGS. 3 and 5. Each gasket 50 is bent from an elongated strip of spring metal material that is electrically conductive. The RFI shielding gasket 50 is basically adapted for use within a grounded metal assembly having an open elongated slot of constant cross-section. Such slots are typically formed by opposed inwardly facing surfaces separated from one another by a selected spacing. In the illustrated embodiment, the inwardly facing surfaces are provided between fence strips 22 and the opposing vertical surfaces of metal insert 23. The resulting slot is adapted to removably receive an elongated edge of a metal wall having a thickness less than the selected spacing of the slot. Such a wall is illustrated by the lowermost sections of the side walls 12 and end walls 15 in the illustrated enclosures 11. The shielding gasket 50 frictionally engages both the surfaces of the slot and the wall received within it.

The formed gasket 50 has a longitudinal bend closing one edge of the gasket 50. In the illustrated embodiment, this one edge constitutes the inner edge of the gasket within the slot in which it is used. An open longitudinal throat is formed at the remaining edge of the folded gasket 50. It includes a pair of opposed, outwardly projecting edges 51 that are parallel to one another and to the inner edge of the gasket 50. The normal maximum transverse width across the edges 51 is greater than the selected spacing between the inner surfaces of the open slots formed between fence strips 22 and the opposing vertical walls of metal insert 23. The gasket configuration is completed by a pair of inwardly bent pinch lines 52 formed in opposition to one another between and parallel to the outer and inner edges of the gasket 50 within the receiving slot. The pinch lines 52 are also formed in directions parallel to the two sharp longitudinal edges 51. The normal transverse spacing between the pinch lines 52 at the interior surfaces of the gasket 50 is less than the thickness of the metal walls 12 and 15 which are engaged by the gasket 50 when enclosure 11 is mounted to the base circuitboard 20.

The outwardly projecting edges 51 at the open longitudinal throat facing upwardly in the open slots of the socket assembly terminate outwardly along elongated corners formed by intersecting longitudinal surfaces. This provides a relatively sharp longitudinal corner configuration at opposite sides of the upper end of each gasket 50 to insure physical and electrical contact between the sides of the gasket 50 and the inwardly facing surfaces of the slot within which it is used.

As seen in FIG. 5, the interior surfaces of the gasket 50 between its one inner edge and the pinch lines 52 are spaced apart by a transverse distance greater than the thickness of the metal walls 12 and 15. This permits the walls 12 and 15 to loosely fit within the folded gasket 50, with line contact at each side of the walls 12 and 15 being insured by the resilient gripping action along the pinch lines 52.

Since the gaskets 50 have substantial length, they are slitted at 54 (FIG. 3) periodically along their lengths to relieve uneven bending forces that might be exerted along a particular gasket 50, thereby permitting the gaskets 50 to conform more completely to irregularities in the wall and receiving slot surfaces. Each slit 54 extends partially inward from the throat of the gasket 50 to a location between its folded inner edge and the pinch lines 52 to facilitate resilient adaptation of the gasket 50 to the metal walls 12 and 15 and slot surfaces formed between the fence strips 22 and the opposed vertical walls of metal insert 23.

As seen in FIG. 5, the gaskets 50 provide a substantial elongated seal between the open bottom walls of enclosure 11 and the receiving upwardly open slot presented between each fence strip 22 and interior insert 23 fixed to the base circuitboard 20. There are four lines of contact between these grounded elements. Referring to FIG. 5, the first line of contact is indicated by reference numeral 55 and is formed between one of the top corner edges 51 and the inner surface of a fence strip 22. The second line of contact, indicated by reference numeral 56, is formed along the center of gasket 50 between a pinch line 52 and a first side of the enclosure wall 12. A third line of contact, indicated by reference numeral 57, is similarly formed between the opposed pinch line 52 and the remaining side of wall 12. The fourth line of contact, indicated by reference numeral 58, is presented by the engagement between the remaining top corner edge 51 along gasket 50 and the inwardly facing vertical surface of metal insert 23. These four lines of contact provide multiple insurance against leakage of radiation through the frictional fittings for each enclosure 11 on the supporting base circuitboard 20. The resiliency of the individual gaskets 50 assures that these lines of contact will be maintained despite structural variations, dimensional variations and other irregularities that might be encountered, since each gasket 50 can shift slightly from one side to the other without losing good contact along the four lines described.

The gaskets 50 normally remain in place due to their frictional engagement at the inner surfaces of the upwardly open slots formed between the metal fence strips 22 and the insert 23. However, when desired, inwardly facing shoulders can be bent or otherwise formed at the top of each slot to retain gaskets 50 when the enclosures 11 are withdrawn upwardly. Examples of such shoulders are shown by dashed lines at 59 in FIG. 5.

The invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims, appropriately interpreted to encompass equivalents.

We claim:

1. A connection and shielding system for modular RF circuits combined with a base circuitboard, comprising:
   a plurality of modular circuitboards, each modular circuitboard containing a ground plane, an RF signal trace, and analog electronic devices that produce a signal in the RF signal trace;
   base circuitboard means for physically and electrically interconnecting a plurality of the modular circuitboards to complete a desired electronic instrument, the base circuitboard having a multilayer structure with two outer ground planes and an inner layer of conductive traces;
   an electrical connector having complementary first and second separable connector elements mounted respectively to one side of the base circuitboard means and to one side of a modular circuitboard, the first and second connector elements having complementary conductors adapted, when joined, to complete a circuit between one conductive trace on the base circuitboard and the RF signal trace on the modular circuitboard;
   the first connector element having a selected conductor electrically connected to the conductive trace on the base circuitboard, with a conductor adjacent to it being electrically connected to at least one ground plane of the base circuitboard;
   the conductor of the second connector element corresponding in location to the selected conductor of the first connector element being electrically connected to the RF signal trace on the modular circuitboard, with a conducator adjacent to it being electrically connected to the ground plane of the modular circuitboard;
   metal enclosure means fixed to and encasing the modular circuitboard for confining electric and magnetic RF fields produced by operation of the modular circuitboard, the enclosure means having an open end defined by peripheral walls that surround the second connector element;
   grounded metal socket means fixed at the one side of the base circuitboard and surrounding the first connector element for frictionally mounting the enclosure means to the base circuitboard with the first and second connector elements joined to one another; and
   RFI gasket means operably connected between the enclosure means and socket means for grounding the enclosure means and preventing escape of radiation from within it while it is mounted to the socket means.

2. The connection and shielding system of claim 1 wherein the grounded metal socket means is fixed to the base circuitboard by at least one continuous peripheral row of closely spaced legs soldered in plated-through holes in the base circuitboard to ground the socket means to the ground plane at the one side of the base circuitboard and to complete a plurality of electrical connections between the socket means and both ground planes of the base circuitboard in a shielding pattern within the base circuitboard that surrounds the location of the first connector element.

3. The connection and shielding system of claim 1 further comprising:
   a filtered electrical connector having complementary first and second separable connector elements mounted to the one side of the base circuitboard and to the modular circuitboard, respectively; and
   the first and second connector elements of the filtered connector being adapted to complete power and control circuits between traces on the base circuitboard and modular circuitboards.

4. The connection and shielding system of claim 1 further comprising:
   a filtered electrical connector having complementary first and second separable connector elements mounted to the one side of the base circuitboard and to the modular circuitboard respectively;
   the first and second connector elements of the filtered connector being adapted, when joined to one another, to complete power and control circuits between traces on the base circuitboard and modular circuitboards; and
   the first connector element of the filtered connector being surrounded by the grounded metal socket means and the filtered connector element of the second connector being surrounded by the peripheral walls at the open end of the metal enclosure means.

5. The connection and shielding system of claim 1 further comprising:
   a filtered electrical connector having complementary first and second separable connector elements mounted to the one side of the base circuitboard and to the modular circuitboard respectively;
   the first and second connector elements of the filtered connector being adapted, when joined to one another, to complete circuits between traces on the base circuitboard and modular circuitboards; and
   the socket means including a base enclosure housing and grounding the first connector element of the filtered connector and isolating it from the electric and magnetic RF fields in the metal enclosure means.

6. The connection and shielding system of claim 1 further comprising:
   a filtered electrical connector having complementary first and second separable connector elements mounted to the one side of the base circuitboard and to the modular circuitboard respectively;
   the first and second connector elements of the filtered connector being adapted, when joined to one another, to complete power and control circuits between traces on the base circuitboard and modular circuitboards;

the first connector element of the filtered connector being surrounded by the grounded metal socket means and the second connector element of the filtered connector being surrounded by the peripheral walls at the open end of the metal enclosure means; and the socket means including a base enclosure housing and grounding the first connector element of the filtered connector, the base enclosure including an intermediate transverse wall physically separating the first connector element of the first connector and the first connector element of the filtered connector at the one side of the base circuitboard, the transverse wall having a continuous row of closely spaced legs that are connected to the base circuitboard by plated-through holes to complete a plurality of electrical connections between the socket means and both ground planes of the base circuitboard in a pattern extending across the transverse wall.

7. The connection and shielding system of claim 1 wherein the one conductive trace on the base circuitboard is run between an adjacent pair of closely-spaced rows of plated through holes electrically connecting the two outer ground planes of the base circuitboard.

8. The connection and shielding system of claim 1 wherein the socket means comprises:

a peripheral metal fence fixed perpendicularly to the one side of the base circuitboard; and a complementary metal insert having outer walls perpendicular to the one side of the base circuitboard and uniformly spaced inwardly from the fence to present an outwardly open slot between the fence and insert.

9. The connection and shielding system of claim 1 wherein the RFI gasket means comprises:

elongated strips of spring metal each folded along a longitudinal centerline to form a two-sided resilient gasket having a longitudinal bend closing one edge of the gasket;

an open longitudinal throat formed at the remaining edge of the gasket, the open longitudinal throat including a pair of opposed outwardly projecting edges that are parallel to one another and to the one edge of the gasket;

the gaskets being frictionally held within peripheral slots open to the exterior of the grounded metal socket means by engagement between the slots and outwardly projecting edges; and the gaskets being frictionally engaged with opposed surfaces of the peripheral walls at the open end of the metal enclosure means along lines located between the outer longitudinal edges of the gasket.

10. The connection and shielding system of claim 1 wherein the RFI gasket means comprises:

elongated strips of spring metal folded along a longitudinal centerline to form a two-sided resilient gasket having a longitudinal bend closing one edge of the gasket;

an open longitudinal throat formed at the remaining edge of the gasket, the open longitudinal throat including a pair of outwardly projecting edges that are parallel to one another and to the longitudinal bend at the one edge of the gasket, and a pair of inwardly-bent pinch lines formed in opposition to one another between and parallel to the two edges of the gasket;

the RFI gasket means being positioned within outwardly open slots formed about the grounded metal socket means, with the opposed outwardly projecting edges of the gasket in frictional engagement with the opposed surfaces of the slot; and the peripheral walls at the open end of the metal enclosure means being received within the gasket and engaged at opposite sides by the pair of pinch lines formed therein.

11. The connection and shielding system of claim 1 wherein the metal enclosure means includes an opening leading to its interior and a ventilated double wall baffle for airflow and RFI shielding disposed across the opening, the double wall baffle comprising:

first and second spaced parallel walls each having a periphery sealingly engaged about the perimeter of the opening; and the first and second baffle walls each having apertures formed therethrough, the apertures of the first and second baffle walls being staggered in position with respect to one another at locations on the two baffle walls that eliminate overlap between the apertures of the two walls in planes perpendicular to the two walls.

12. The connection and shielding system of claim 11 wherein both the first and second baffle walls are provided with a plurality of apertures arranged in patterns that eliminate overlap between the apertures of the two walls in planes perpendicular to them.

13. The connection and shielding system of claim 1 wherein the electrical connector includes a plurality of pins and sockets releasably engageable with one another as the conductors on the first and second connector elements, all conductors immediately adjacent to the selected conductor of the first connector element and corresponding conductor of the second connector element being electrically connected to at least one ground plane of the base circuitboard.

14. A connection and shielding system for modular RF circuits combined with a base circuitboard, comprising:

a plurality of modular circuitboards, each modular circuitboard containing a ground plane, an RF signal trace, and analog electronic devices that produce a signal in the RF signal trace;

a base circuitboard having a multi-layer structure with two outer ground planes and an inner layer of conductive traces adapted to interconnect RF signal traces of the modular circuitboards;

an electrical connector having complementary first and second separable connector elements mounted respectively to one side of the base circuitboard and to one side of a modular circuitboard, the first and second connector elements having complementary conductors adapted, when joined to one another, to complete a circuit between one conductive trace on the base circuitboard and the RF signal trace on the modular circuitboard;

the first connector element having a selected conductor electrically connected to the conductive trace on the base circuitboard, with the conductors adjacent to it being electrically connected to both ground planes of the base circuitboard;

the conductor of the second connector element corresponding in location to the selected conductor of the first connector element being electrically connected to the RF signal trace on the modular circuitboard, with the conductors adjacent to it being electrically connected to the ground plane of the modular circuitboard;

a five-sided metal enclosure fixed to and encasing the modular circuitboard, the enclosure having an open end defined by intersecting peripheral walls that surround the second connector element;

a grounded metal socket assembly fixed to the one side of the base circuitboard, the socket assembly including an open metal slot surrounding the first connector element and receiving the peripheral walls at the open end of the enclosure to locate the ground plane at the one side of the base circuitboard across the open end of the enclosure to serve as its sixth side and to provide electrical access to the signal trace of the modular circuitboard through the electrical connector without interruption of the RF shielding provided by the enclosure;

an elongated resilient RFI gasket engaged within the slot of the socket assembly and wrapped about the peripheral walls at the open end of the enclosure in frictional engagement with opposite sides of the peripheral walls to ground the enclosure and prevent escape of radiation from within it while it is mounted to the socket assembly; and the one conductive trace on the base circuitboard being positioned between an adjacent pair of closely-spaced rows of plated through holes electrically connecting the two outer ground planes of the base circuitboard to form a ground return path along the conductive trace.

* * * * *

UNITED STATES PATENT AND TRADEMARK OFFICE
CERTIFICATE OF CORRECTION

PATENT NO. : 4,868,716

DATED : September 19, 1989

INVENTOR(S) : David B. Taylor et al.

It is certified that error appears in the above-identified patent and that said Letters Patent is hereby corrected as shown below:

Column 9, line 54, Claim 1, "conducator" should be --conductor--.

Signed and Sealed this

Twenty-second Day of December, 1992

Attest:

DOUGLAS B. COMER

*Attesting Officer*  *Acting Commissioner of Patents and Trademarks*